United States Patent
Shylo et al.

(10) Patent No.: US 8,269,239 B2
(45) Date of Patent: Sep. 18, 2012

(54) LIGHT EMITTING DIODE CHIP PACKAGE

(75) Inventors: Sergiy Shylo, Gyunggi-do (KR); Mi Jeong Yun, Daejeon (KR)

(73) Assignee: Samsung Electronics Co., Ltd., Seoul (KR)

( * ) Notice: Subject to any disclaimer, the term of this patent is extended or adjusted under 35 U.S.C. 154(b) by 435 days.

(21) Appl. No.: 12/007,836

(22) Filed: Jan. 16, 2008

(65) Prior Publication Data

US 2008/0173889 A1 Jul. 24, 2008

(30) Foreign Application Priority Data

Jan. 18, 2007 (KR) ................ 10-2007-0005684

(51) Int. Cl.
*H01L 33/00* (2010.01)
(52) U.S. Cl. ................. 257/98; 257/E33.072
(58) Field of Classification Search .............. 257/98, 257/E33.072

See application file for complete search history.

(56) References Cited

U.S. PATENT DOCUMENTS

| 5,882,774 | A | * | 3/1999 | Jonza et al. | 428/212 |
| 2004/0085660 | A1 | * | 5/2004 | Hara | 359/883 |
| 2004/0116033 | A1 | * | 6/2004 | Ouderkirk et al. | 445/23 |
| 2005/0265029 | A1 | * | 12/2005 | Epstein et al. | 362/339 |
| 2006/0170335 | A1 | | 8/2006 | Cho et al. | |
| 2006/0284196 | A1 | * | 12/2006 | Setlur et al. | 257/98 |

* cited by examiner

*Primary Examiner* — Lynne Gurley
*Assistant Examiner* — Hsin-Yi Hsieh
(74) *Attorney, Agent, or Firm* — McDermott Will & Emery LLP (57) ABSTRACT

A light emitting diode (LED) chip package including: a package body; an LED chip mounted on the package body and emitting an excited light; a phosphor layer including a phosphor absorbing the excited light and emitting a wavelength conversion light obtained by converting a wavelength of the excited light and a phosphor resin mixed with the phosphor; and a reflector layer including a reflector formed between the LED chip and the phosphor layer, transmitting the excited light to the phosphor layer, and reflecting the wavelength conversion light from the phosphor layer, and a reflector resin mixed with the reflector.

10 Claims, 7 Drawing Sheets

PRIOR ART

FIG. 1d

PRIOR ART

LIGHT EMITTING DIODE CHIP PACKAGE

CROSS-REFERENCE TO RELATED APPLICATIONS

This application claims the priority of Korean Patent Application No. 2007-0005684 filed on Jan. 18, 2007, in the Korean Intellectual Property Office, the disclosure of which is incorporated herein by reference.

BACKGROUND OF THE INVENTION

1. Field of the Invention

The present invention relates to a light emitting diode (LED) chip package, and more particularly, to an LED chip package with improving entire light emitting efficiency by transmitting an excited light from an LED chip and absorbing the excited light in a phosphor and emitting a wavelength conversion light obtained by converting a wavelength of the excited light.

2. Description of the Related Art

A light emitting diode (LED) is a solid light emitting device formed of a semiconductor, which is more stable and reliable than other thermal conversion LEDs and has a long life. Also, since it is possible to drive the LED by using a voltage of several V and a current of several tens mA, power consumption is small, which makes utility thereof be increased. Such LED emits light close to approximately single color light, which is different from light having a wide light emitting spectrum from an incandescent bulb.

Recently, LEDs capable of emitting white light or embodying a plurality of colors have been developed. As a method of manufacturing a white light LED, there are a method of mixing LED chips of red, green, and blue to emit white light and a method of mixing an LED chip emitting light of a certain color with a phosphor emitting fluorescent light. White LEDs currently used are generally manufactured by using the latter method.

For example, a white LED chip package may be obtained by encapsulating a blue LED chip with a molding resin where yellow phosphors are scattered. When light in a wavelength of 460 nm is emitted from the blue LED chip, light in a wavelength of 545 nm is emitted from the yellow phosphor absorbing the light from the blue LED chip, thereby outputting white light by mixing two types of light whose wavelength is different from each other.

FIGS. 1A to 1D are cross-sectional views illustrating conventional LED chip packages emitting white light and various color light using phosphors as described above.

Figure 1A:
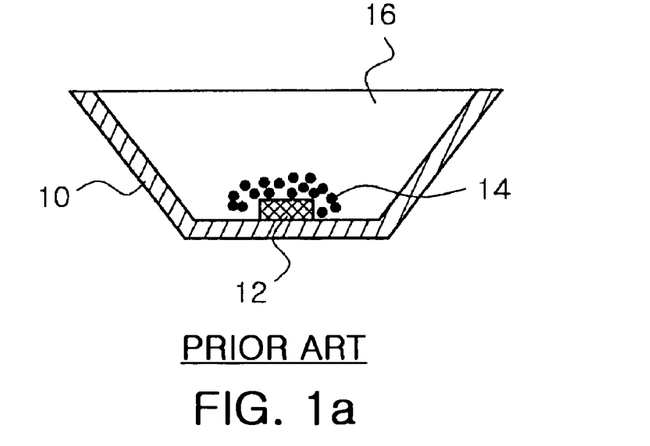
FIGS. 1A to 1D are cross-sectional views illustrating conventional LED chip packages, respectively.

Referring to FIG. 1A, an LED chip package includes a package body 10, an LED chip 12 mounted on the package body 10, phosphors 14 scattered on the LED chip 12, and a transparent resin layer 16 containing the phosphors 14 and encapsulating the LED chip 12. In addition, not shown in the drawing, a lead frame and wire bonding may be further included to electrically connect the LED chip 12 to an external power supply thereof.

Since the phosphors 14 are concentrated on the LED chip 12, the LED chip package obtains an excited light from the LED chip 12 and a wavelength conversion light having a different wavelength from the excited light and emitted from the phosphors 14 absorbing the excited light easily returns to the LED chip 12 to be absorbed thereto, thereby increasing a temperature of the LED chip 12 in such a way that the LED chip 12 is deteriorated and becomes unreliable. Also, since a path where the excited light and the wavelength conversion light are transmitted to the outside of the LED chip package is long, which makes emission thereof disadvantageous. Also, due to heat generated when the LED chip 12 emits light, the phosphors 14 are deteriorated, which may have a bad effect on emitting light.

Figure 1B:
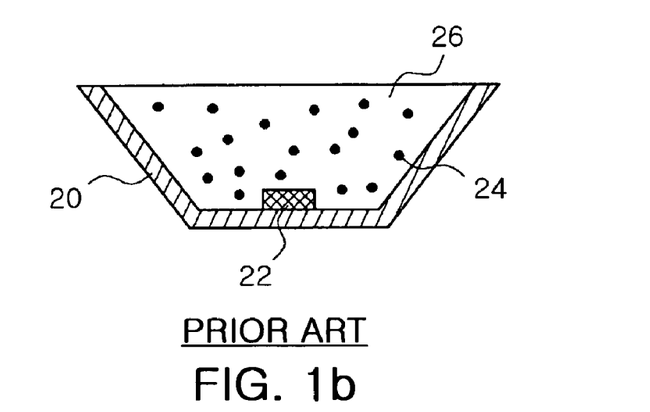

FIG. 1B illustrates an LED chip package where phosphors 24 are uniformly scattered in a transparent resin layer 26. Since a path where a wavelength conversion light is transmitted is relatively short in a structure of the LED chip package, emission thereof is easy. However, the excited light may be reflected before the phosphors 24 absorb excited light to return to an LED chip 22 to be exhausted or to be transmitted to a reflective plate to be exhausted via several reflections.

Figure 1C:
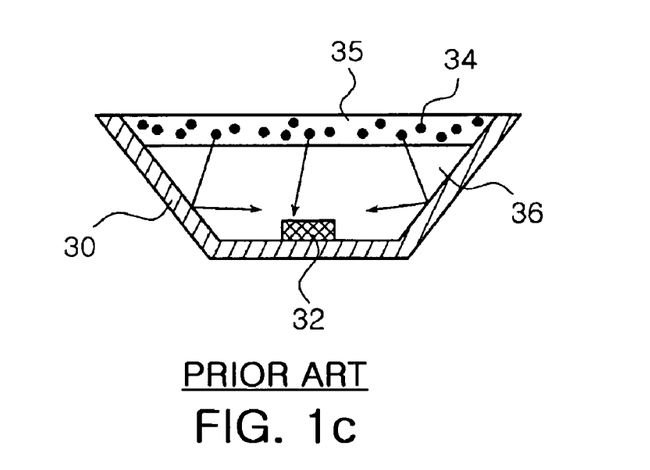

FIG. 1C illustrates an LED chip package including a remote phosphor layer 35, considering the defects as described above. In this case, phosphors 34 are not contained in a transparent resin layer 36 and form a layer in addition to the transparent resin layer 36. Accordingly, when an excited light is transmitted from an LED chip 32 to the phosphors 34, generates a wavelength conversion light, and is reflected by the phosphors to the inside a package body 30, the excited light may be hardly affected by the LED chip 32, pass through the package body 30, and be emitted outside. Also when being emitted to the inside of the package body 30, the wavelength conversion light may be continuously transmitted and emitted outside.

However, in this case, when the excited light and the wavelength conversion light are transmitted the inside of the package body 30, the excited light and the wavelength conversion light may be continuously reflected and transmitted to be exhausted or absorbed into the LED chip 32 to be exhausted. Accordingly, there is an attempt to increase an amount of light emitted outside of the package body 30 by diffuse reflecting light transmitted to the inside of the package body 30.

Figure 1D:
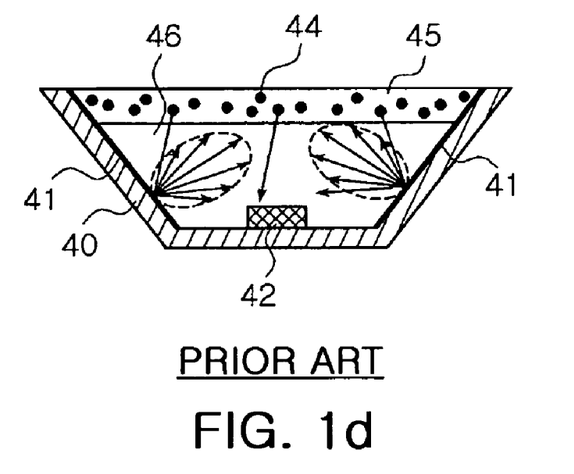

FIG. 1D illustrates an LED chip package including an LED chip 42, phosphors 44, a transparent resin layer 46, and a remote phosphor layer 45, the LED chip package being capable of diffuse reflecting and emitting an excited light and a wavelength conversion light transmitted inside by using diffuse reflection layers 41 and 41' formed on a package body 40. By forming the diffuse reflection layers 41 and 41', a light emitting device having higher light emitting efficiency may be manufactured.

Light emitting efficiencies of the LED chip packages shown in FIGS. 1A to 1D are approximately 45.3%, 66.6%, 61.7%, and 79.6%, which are gradually increased. However, there is still required higher light emitting efficiency.

Figure 2:
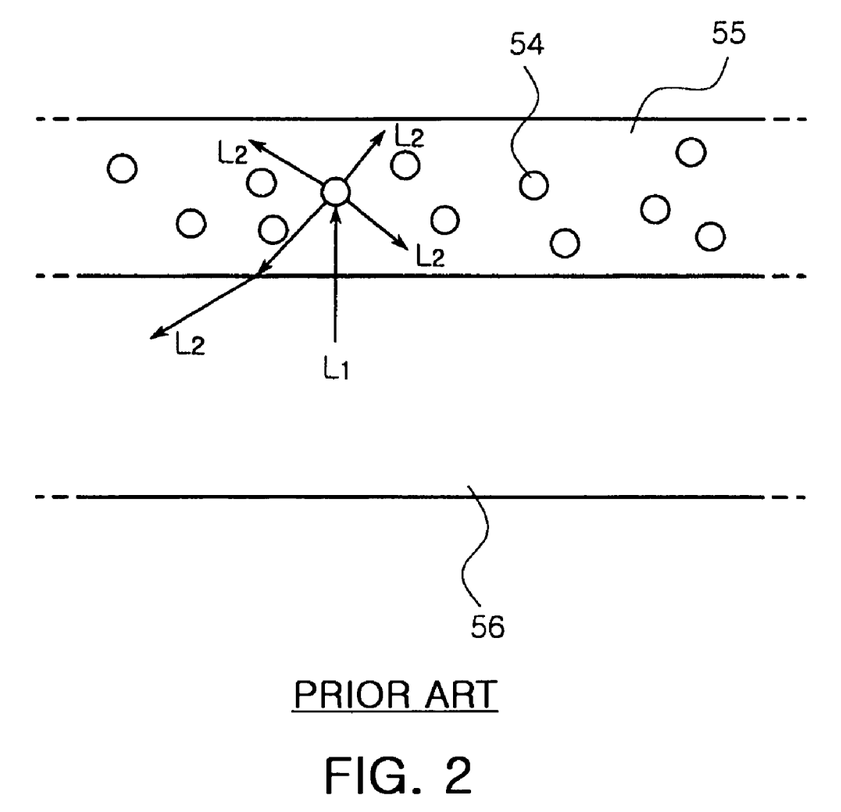
FIG. 2 is a diagram illustrating a generation of a wavelength conversion light from an excited light in a conventional LED chip package.

FIG. 2 is a diagram illustrating a generation of a wavelength conversion light from an excited light in a conventional LED chip package. Referring to FIG. 2, there is shown an LED chip package where a remote phosphor layer is formed as FIGS. 1C and 1D.

Phosphors 54 are distributed a phosphor resin 55 capable of being mixed with phosphors and being formed on a package body. When an excited light L1 with a wavelength of $\lambda_{L1}$ enters into the phosphor 54, a wavelength conversion light L2 with a wavelength of $\lambda_{L2}$ different from that of the excited light is generated in the phosphors 54 and diffused in all directions. In this case, when the wavelength conversion light L2 is transmitted to a transparent resin layer 56, the wavelength conversion light L2 may be lost. That is, the wavelength conversion light L2 entering into a package body of the LED chip package may be exhausted while continuously reflected or may be exhausted while entering and being absorbed into an LED chip. Accordingly, due to a loss of the wavelength conversion light L2, entire light emitting efficiency of the LED chip package is reduced.

SUMMARY OF THE INVENTION

An aspect of the present invention provides an LED chip package with improved entire light emitting efficiency by transmitting an excited light from an LED chip and reflecting a wavelength conversion light obtained by converting a wavelength of the excited light in phosphors and transmitted to the LED chip.

According to an aspect of the present invention, there is provided a light emitting diode (LED) chip package including: a package body; an LED chip mounted on the package body and emitting an excited light; a phosphor layer including a phosphor absorbing the excited light and emitting a wavelength conversion light obtained by converting a wavelength of the excited light and a phosphor resin mixed with the phosphor; and a reflector layer including a reflector formed between the LED chip and the phosphor layer, transmitting the excited light to the phosphor layer, and reflecting the wavelength conversion light from the phosphor layer, and a reflector resin mixed with the reflector.

In this case, a refractive index of the reflector and a refractive index of the reflector resin may be identical to each other at the wavelength of the excited light.

When the LED chip is a blue LED, the reflector and the reflector resin may have the same refractive index at a wavelength of light emitted from the blue LED.

When the LED chip is an UV LED, the reflector and the reflector resin may have the same refractive index at a wavelength of light emitted from the UV LED.

The reflector may have a radius of 1 to 150 μm. The reflector may be one selected from a group consisting of optical glass, silica, talc, zirconium, zinc oxide, and titanium dioxide.

The reflector resin mixed with the reflector may be one selected from a group consisting of a polymethyl methacrylate (PMMA) resin, a polystyrene resin, a polyurethane resin, a benzoguanamine resin, and silicone.

The excited light from the LED chip may be a blue light and the wavelength conversion light from the phosphor may be a yellow light.

The LED package may be a white LED package.

The package body may include a reflective plate.

Also, the LED package may further include a transparent resin layer formed between the LED chip and the reflector layer and transmitting the excited light.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

Figure 3:
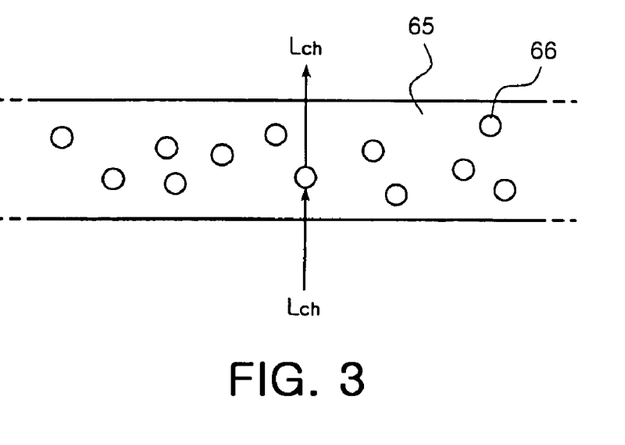
FIG. 3 is a diagram illustrating Christiansen effect in particles in a medium.

FIG. 3 is a diagram illustrating Christiansen effect in particles in a medium.

Generally, when light passing through a medium reaches particles, the light is diffused at an interface between the particles and the medium according to a difference in a refractive index therebetween. However, when a refraction index of the medium is identical to that of the particles, the light is not diffused and is transmitted as it is in a direction where the light is transmitted at the interface between the particles and the medium.

This phenomenon is designated "Christiansen effect". That is, a refractive index of a material vary with a wavelength, a refractive index of particles may be identical to that of a medium at a certain wavelength, and light having a wavelength identical to the certain wavelength is not diffused at an interface between the particles and the medium and passes through the particles. In this case, the certain wavelength is designated as "Christiansen wavelength".

Referring to FIG. 3, light Lch with a wavelength λch is incident upon a medium 65. In this case, proceeding of light before incident upon the medium 65 and after leaving the medium is not considered. The light Lch proceeds in the medium 65 and enters into particles 66. In this case, Christiansen wavelengths of the medium 65 and the particles are λch, the light Lch passes through the particles 66 and the medium 65 without diffusion. When the Christiansen wavelengths are not λch, since a refractive index of the particles 66 is different from that of the medium at the wavelength of λch, the light Lch is diffused at an interface between the particles 66 and the medium 65.

Figure 4:
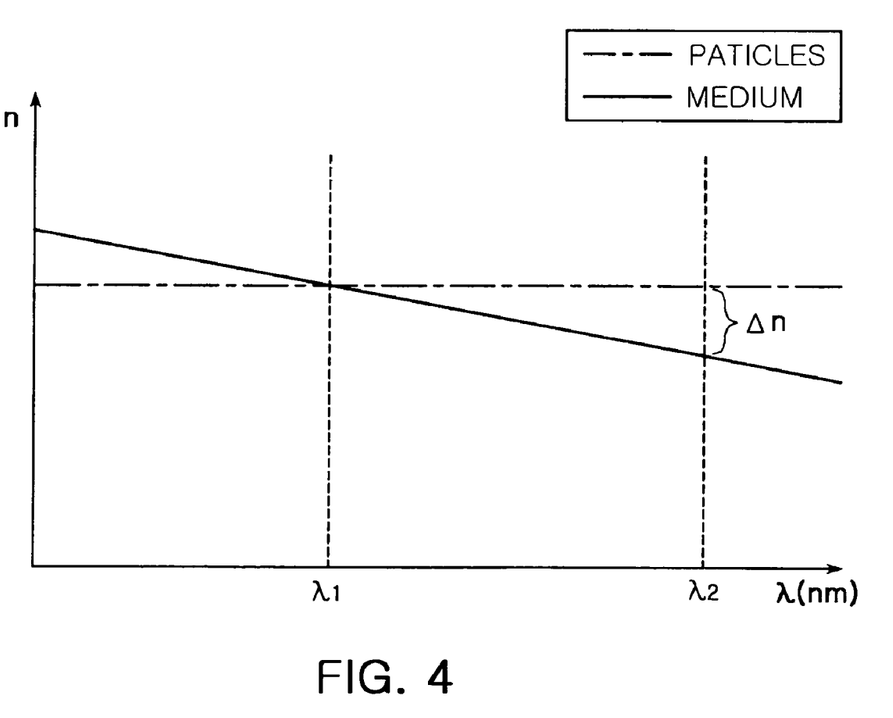
FIG. 4 is a graph illustrating refractive indexes of the medium and the particles of FIG. 3.

FIG. 4 is a graph illustrating the refractive indexes of the medium 65 and the particles 66. Hereinafter, FIGS. 3 and 4 are referred for description.

A curve of the refractive index of the particles 66 crosses a curve of the refractive index of the medium 65 at λ1. That is, the curve of the refractive index of the particles 66 is identical to the curve of the refractive index of the medium 65 at λ1. Accordingly, λ1 is Christiansen wavelength. In this case, light having a wavelength of λ1 passes through the particles 66 without diffusion. On the other hand, in the case of λ2, the refractive index of the particles 66 is not identical to that of the medium 65 and a difference of Δn is present therebetween.

Accordingly, light with a wavelength of λ2 is diffused at the interface between the medium 65 and the particles 66.

Figure 5:
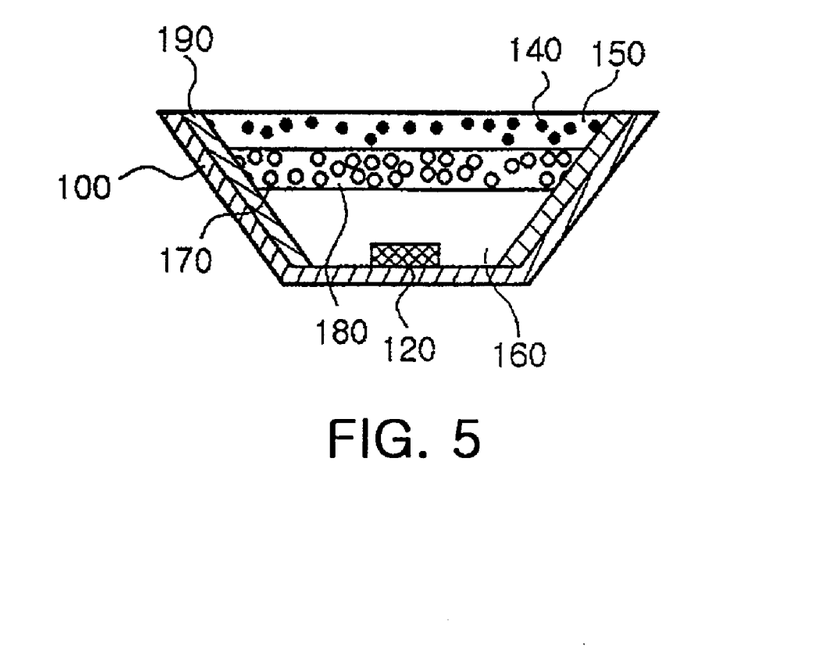
FIG. 5 is a diagram illustrating a light emitting diode (LED) chip package according to an exemplary embodiment of the present invention.
Figure 6:
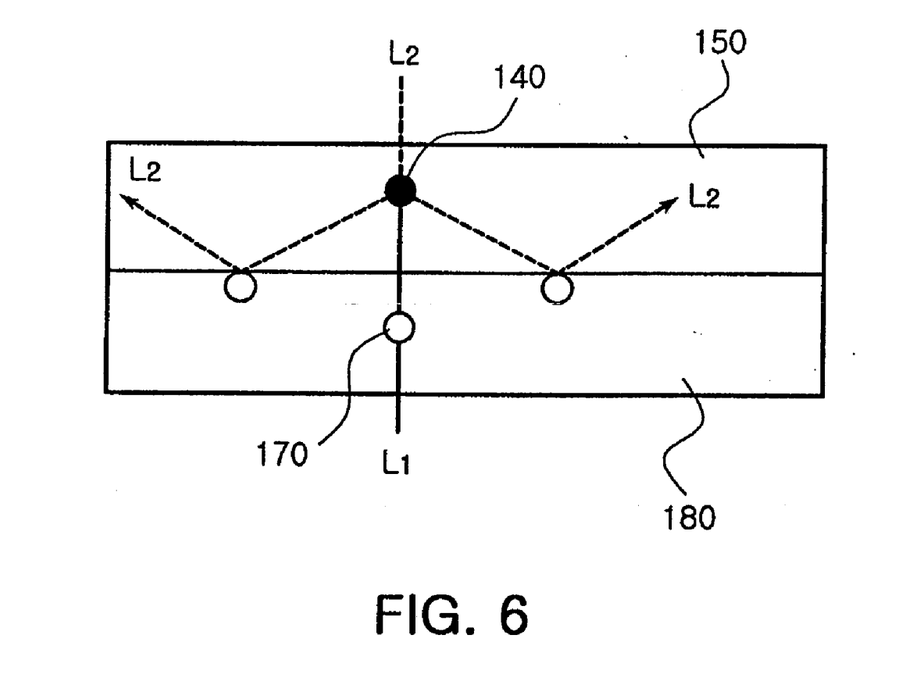
FIG. 6 is a diagram illustrating an excited light and a wavelength conversion light in the LED chip package of FIG. 5.

FIG. 5 is a diagram illustrating a light emitting diode (LED) chip package according to an exemplary embodiment of the present invention, and FIG. 6 is a diagram illustrating an excited light and a wavelength conversion light in the LED chip package of FIG. 5. Hereinafter, the embodiment of the present invention will be described with reference to FIGS. 5 and 6 and a description on the same configuration described above will be omitted.

The LED chip package includes a package body 100; an LED chip 120 mounted on the package body and emitting an excited light; a phosphor layer including a phosphor 140 absorbing the excited light and emitting a wavelength conversion light obtained by converting a wavelength of the excited light and a phosphor resin 150 mixed with the phosphor 140; and a reflector layer including a reflector 170 formed between the LED chip 120 and the phosphor layer, transmitting the excited light to the phosphor layer, and reflecting the wavelength conversion light from the phosphor layer, and a reflector resin 180 mixed with the reflector 170. In addition, not shown, a lead frame and wire bonding may be included to electrically connect the LED chip 120 to an external power supply.

Also, the package body 100 includes a transparent resin layer 160 formed between the LED chip 120 and the reflector layer and transmitting the excited light.

When receiving a voltage the LED chip 120 emits the excited light. The excited light passes through the transparent resin layer 160 and transmitted to the reflector layer. The reflector resin 180 may be formed of a resin identical to the transparent resin layer 160 to prevent reflection and diffusion at an interface between the transparent resin layer 160 and the reflector resin 180.

Accordingly, the excited light passes through the reflector resin 180 and is transmitted to the reflector 170. A refractive index of the reflector 170 may be identical to that of the reflector resin 180 at the wavelength of the excited light. In this case, to obtain Christiansen effect with respect to the excited light, the wavelength of the excited light is determined as a Christiansen wavelength and the refractive indexes of the reflector 170 and the reflector resin 180 are identical to each other at the Christiansen wavelength. Accordingly, the excited light may be not diffused at the interface between the reflector 170 and the reflector resin 180 and may proceed as it is to be transmitted to the phosphor layer. Due to the Christiansen effect, the excited light may be emitted.

When passing through the reflector layer, the excited light is transmitted to the phosphor resin 150. The reflector resin 180 and the phosphor resin 150 may be formed of one of the same resin and resins having a similar refractive index in such a way that reflection and diffusion at an interface therebetween are prevented as possible. To assist that the excited light proceeds to the outside, the package body 100 may include a reflective plate 190. When the excited light passes through the phosphor resin 150 and is transmitted to the phosphor 140, the phosphor 140 absorbs the excited light and emits light having a wavelength different from that of the excited light, that is, a wavelength conversion light.

Referring to FIG. 6, a wavelength L2 is emitted in all directions as described with reference to FIG. 2. The wavelength L2 may pass through the phosphor layer and be emitted to the outside of the LED chip package. On the other hand, the wavelength L2 may proceed to the inside of the LED chip package. In this case, when incident upon the reflector layer and transmitted to the reflector 170, the wavelength L2 is diffused in the reflector 170. As described above, the refractive index of the reflector 170 is identical to that of the reflector resin 180 at the wavelength of the excited light but is not identical at the wavelength of the wavelength conversion light L2, which is different. This will be described in detail with reference to FIG. 7.

Therefore, the wavelength conversion light L2 transmitted to the reflector 170 is diffused. Accordingly, a proceeding direction of the wavelength conversion light L2 is changed and the wavelength conversion light L2 does not proceed into the LED chip package and proceeds toward the outside.

The LED chip package transmits an excited light L1 and reflects the wavelength conversion light L2 since including the reflector 170 and the reflector resin 280. Accordingly, light emitting efficiency of the LED chip package is increased.

The reflector 170 may be one of an optically transparent polymer and an optically transparent glass bead. For example, the reflector 170 may be selected from a group consisting of optical glass, silica, talc, zirconium, zinc oxide, and titanium dioxide.

The reflector resin 180 mixed with the reflector 170 may be formed of a resin compatible with the transparent resin layer 160 and the phosphor resin 150 as described above. Also, the resin forming the reflector resin 180 may have a refractive index identical to that of the reflector 170 at a certain wavelength as described above. The certain wavelength may be a wavelength of the excited light L1 and may be not the wavelength of the wavelength conversion light L2. To increase light emitting efficiency, the excited light L1 is transmitted to the outside of the LED chip package and the wavelength conversion light L2 is reflected since proceeding into the LED chip package.

The reflector resin 180 may be selected from a group consisting of polymethyl methacrylate (PMMA) resin, a polystyrene resin, a polyurethane resin, a benzoguanamine resin, and silicone.

To form the reflector 170 and the reflector resin 180, it is required to check a wavelength of an excited light. For example, when an LED chip is a blue LED, a reflector and a reflector resin may be formed of a material having the same refractive index at a light emitting wavelength of the blue LED.

When an LED chip is an UV LED, a reflect and a reflector resin may be a material having the same refractive index at a light emitting wavelength of the UV LED.

Figure 7:
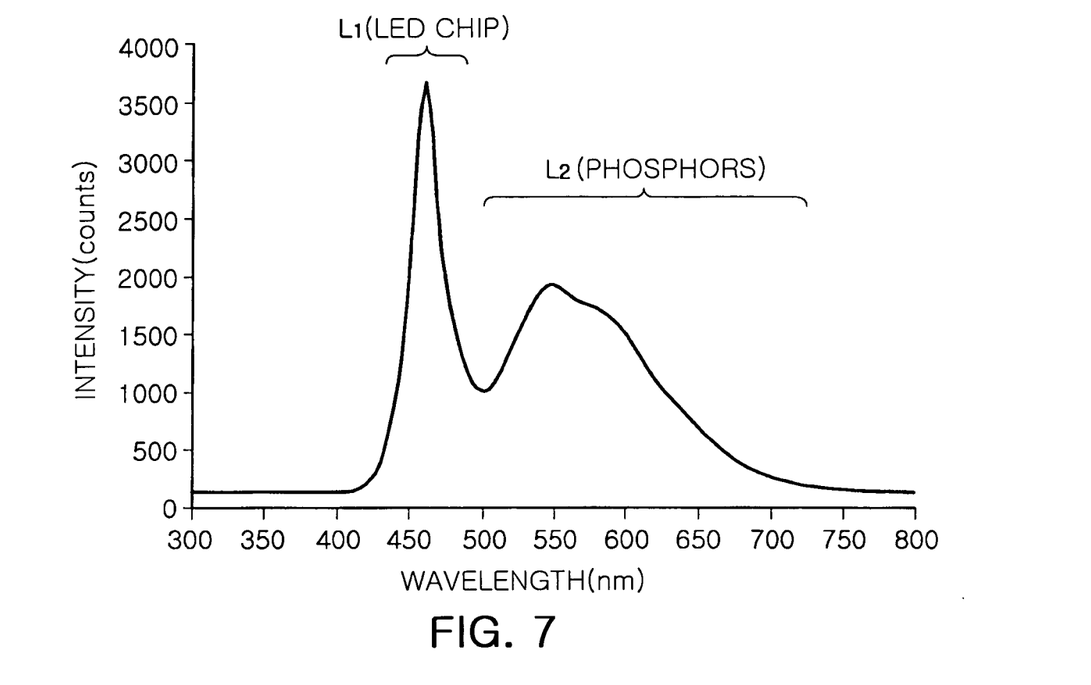
FIG. 7 is a diagram illustrating an optical spectrum of the case where the excited light is a blue light and the wavelength conversion light is a yellow light in the LED chip package.

FIG. 7 is a diagram illustrating an optical spectrum of the case where an excited light is a blue light and a wavelength conversion light is a yellow light in the LED chip package. FIGS. 5, 6, and 7 will be referred for description. The excited light from the LED chip 120 is a blue light having a peak at 450 nm. Accordingly, the refractive indexes of the reflector 170 and the reflector resin 180 may be identical to each other at 450 nm. In this case, the excited light is not diffused at the interface between the reflector resin 180 and the reflector 170 and passes through the interface.

On the other hand, the wavelength conversion light L2 form the phosphor 140 has a peak at 550 nm. Accordingly, the refractive indexes of the reflector 170 and the reflector resin 180 may be different from each other at 550 nm. Since the refractive indexes of the reflector resin 180 and the reflector 170 are different from each other, the wavelength conversion light L2 is diffused at the interface, thereby changing a proceeding direction of the wavelength conversion light L2 proceeding into the LED chip package.

FIGS. 8A to 8E are graphs illustrating diffuse reflectance for each concentration of a reflector and each thickness of a reflector layer when a radius of the reflector is constant.

A relationship between parameters of the reflector and the reflector layer and one of reflection and transmission of light incident upon the reflector layer is disclosed in "A Theory for the Christiansen Filter" (Applied Optics, Vol 7, No. 5, May 1968, by R. H. Clarke).

When particles having a radius of r are present in a concentration of c in a layer with a predetermined thickness L, optical transmittance T of light incident upon the layer is as follows.

$$T = \exp[-48.7 \cdot c \cdot L \cdot r \cdot (\Delta n)^2 \cdot (\Delta\lambda/\lambda_c)^2] \quad \text{Equation (1)}$$

wherein C indicates a concentration of particles, which is a total volume of the particles per entire volume of a layer, L indicates a thickness of the layer, and r indicates an average particle radius. $\lambda_c$ indicates Christiansen wavelength, $\Delta\lambda$ indicates a wavelength flux from $\lambda_c$, that is, a difference between a wavelength of light and the Christiansen wavelength. $\Delta n'$ indicates a rate of change with respect to a wavelength of a difference between a refractive index of a medium and that of the particles and may be shown as follows.

$$\Delta n' = \frac{d}{d\lambda}(n_{medium} - n_{particles}) \quad \text{Equation (2)}$$

When a concentration of the particles present in the layer is high enough, related to the optical transmittance T, a reflectance R may be approximated as follows.

$$R_\infty = 1 - T \quad \text{Equation (3)}$$

Referring to Equation 1, the optical transmittance T is in inverse proportion to the concentration of the particles, the thickness of the layer, the radius of the particles, the rate of change with respect to the wavelength of the difference between the refractive indexes of the medium and the particles, and the wavelength flux from the Christiansen wavelength to the wavelength of the light. As the optical transmittance T becomes small, the reflectance R becomes grate. Accordingly, it is expected that the parameter in inverse proportion to the optical transmittance T is in proportion to the reflectance R.

As described above, FIGS. 8A to 8E are graphs illustrating diffuse reflectance for each concentration of a reflector and each thickness of a reflector layer when a radius of the reflector is constant. In FIGS. 8A to 8E, $\Delta\lambda$ is 0.1 μm, $\Delta n'$ is 0.04, and $\lambda_c$ is 0.47 μm. Since indicating the total volume of the reflector per entire volume of the reflector layer, the concentration has no unit. The radiuses of the reflector in FIGS. 8A to 8E are 15, 10, 5, 2, and 1 μm, respectively, which gradually becomes smaller. Curves in FIGS. 8A to 8E indicate the same diffuse reflection rate, which is increased by 0.1 from 0.1 to 0.9.

Figure 8A:
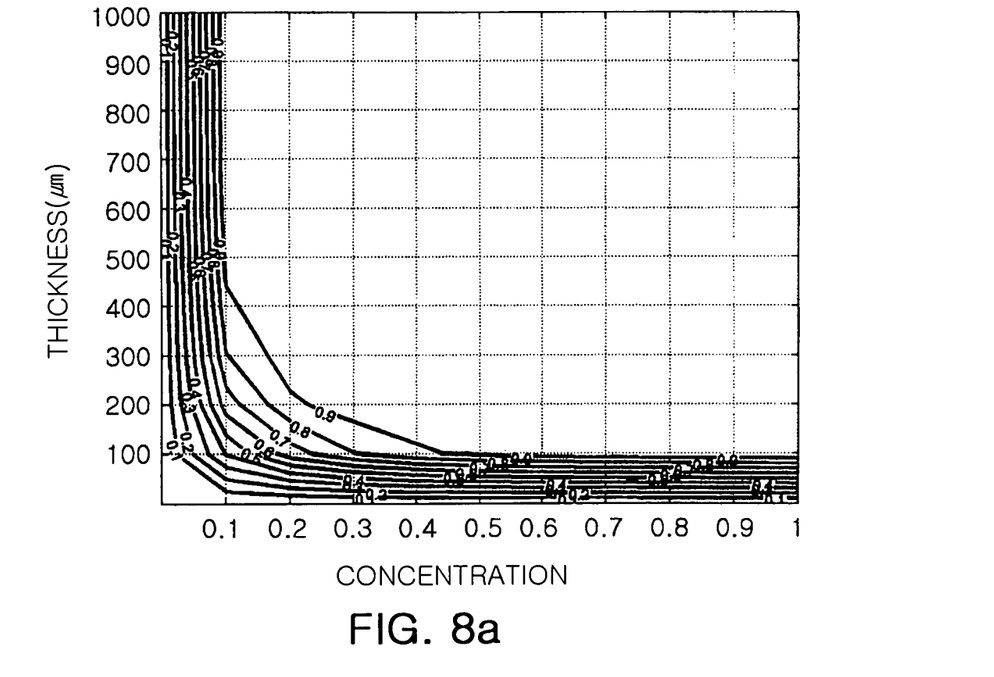
FIGS. 8A to 8E are graphs illustrating diffuse reflectance for each concentration of a reflector and each thickness of a reflector layer when a radius of the reflector is constant.
Figure 8B:
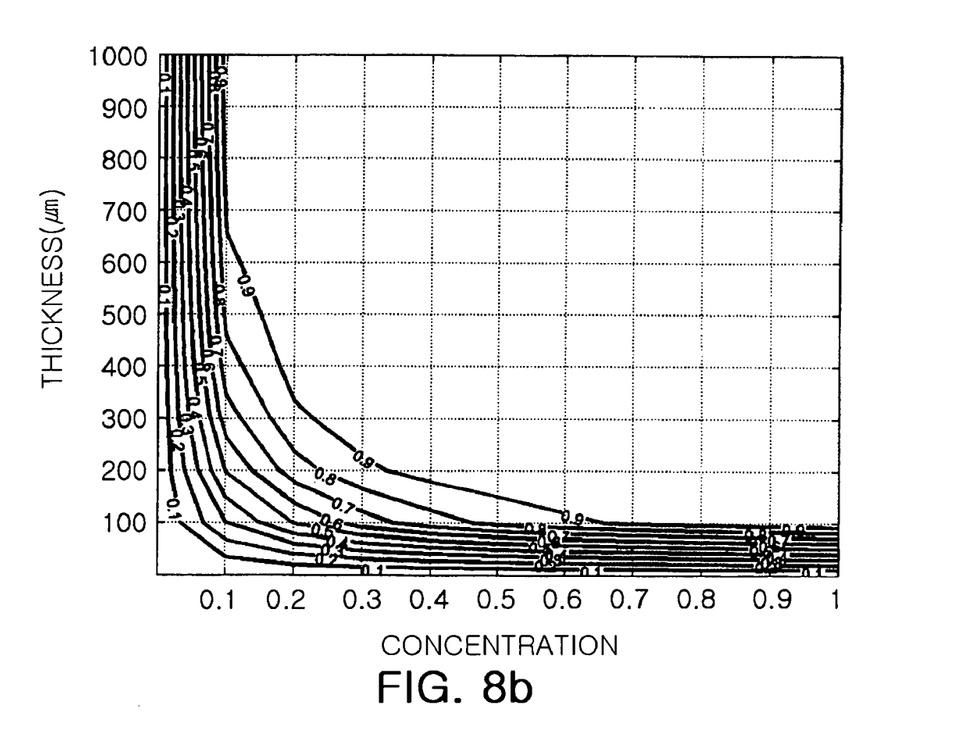
Figure 8C:
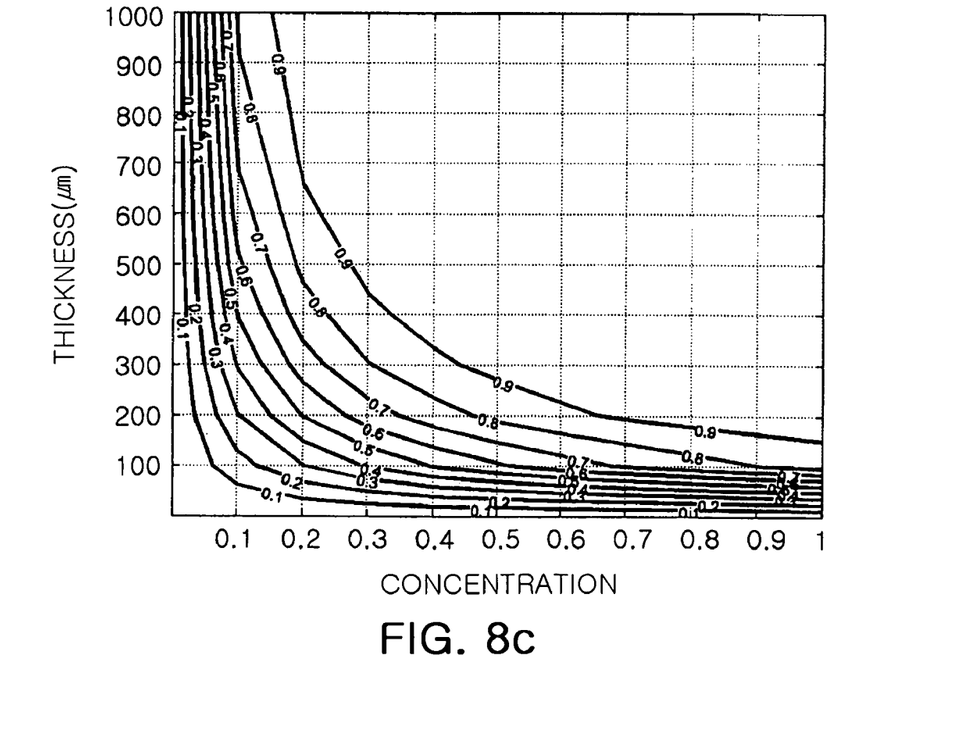
Figure 8D:
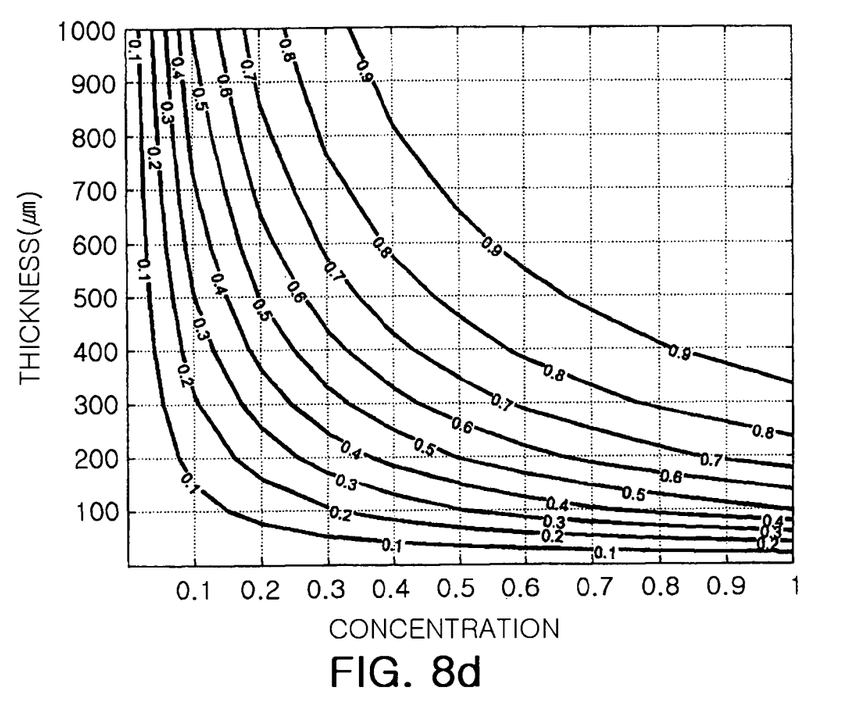
Figure 8E:
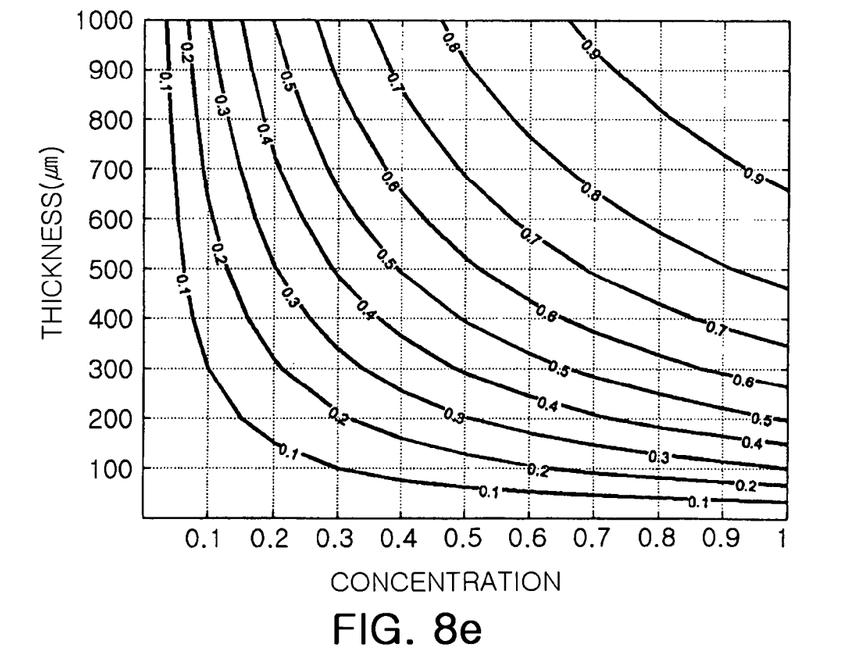

Referring to FIGS. 8A to 8E, it may be known that a diffuse reflection rate of the reflector layer increases as the concentration of the reflector becomes high and the thickness of the reflector layer becomes great. Also, when the radius of the reflector is grate, though the thickness of the reflector layer is small, the diffuse reflection rate is high. This may be known by comparing FIG. 8A with FIG. 8E. In FIG. 8A, since a diffuse reelection rate curve is slant downward, though the thickness of the reflector layer is small, the diffuse reflection rate is high. In FIG. 8E, since a diffuse reflection rate curve is slant upward, the thickness of the reflector layer should be greater to obtain a diffuse reflection rate of the same degree.

For example, checking a diffuse reflection rate of the case where the concentration of the reflector is within a range from 0.2 to 0.3, in FIG. 8A where the radius of the reflector is 15 μm, the thickness of the reflector layer should be formed to be within a range from about 150 to 250 mm to obtain a diffuse reflection rate of 0.9. On the other hand, in 8E where the radius of the reflector is 1 μm, the thickness of the reflector should be much more than 1000 μm to obtain the diffuse reflection rate of 0.9 as in FIG. 8E.

When the radius of the reflector is smaller than 1 μm, to obtain a desired diffuse reflection rate, the concentration of the reflector and the thickness of the reflector layer should be higher. Accordingly, a proportion of the reflector layer to the LED chip package becomes higher, which is not desirable. When a difference between the refractive indexes of the reflector resin and the reflector is small, a radius of a usable reflector increases. Considering this, the radius of the reflector may be within a range from 1 to 150 μm.

As described above, according to an exemplary embodiment of the present invention, there is provided an LED chip package where an excited light from an LED chip is transmitted, a phosphor absorbs the excited light and generates a wavelength conversion light whose wavelength is different from the excited light, and the wavelength conversion light proceeding to the LED chip is reflected, thereby improving entire light emitting efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode (LED) chip package comprising:
a package body having a cavity to receive an LED chip therein;
the LED chip mounted on the package body and emitting an excited light;
a phosphor layer including a phosphor absorbing the excited light and emitting a wavelength conversion light obtained by converting a wavelength of the excited light and a phosphor resin mixed with the phosphor; and
a reflector layer including a particle-shaped reflector formed between the LED chip and the phosphor layer, transmitting the excited light to the phosphor layer, and reflecting the wavelength conversion light from the phosphor layer, and a reflector resin mixed with the reflector,
wherein the phosphor layer and the reflector layer are attached to an inner wall of the cavity, enclosing the cavity provided therein, and
wherein the reflector and the reflector resin have a same refractive index at the wavelength of the excited light and have a different refractive index at a wavelength of the converted light.

2. The LED chip package of claim 1, wherein the LED chip is a blue LED.

3. The LED chip package of claim 1, wherein the LED chip is an UV (Ultra Violet) LED.

4. The LED chip package of claim 1, wherein the reflector has a radius of 1 to 150 μm.

5. The LED chip package of claim 1, wherein the reflector is one selected from a group consisting of optical glass, silica, talc, zirconium, zinc oxide, and titanium dioxide.

6. The LED chip package of claim 1, wherein the reflector resin is one selected from a group consisting of a polymethyl methacrylate (PMMA) resin, a polystyrene resin, a polyurethane resin, a benzoguanamine resin, and silicone.

7. The LED chip package of claim 1, wherein the excited light is a blue light and the wavelength conversion light is a yellow light.

8. The LED chip package of claim 1, wherein the LED chip package is a white LED chip package.

9. The LED chip package of claim 1, wherein the package body comprises a reflective plate.

10. The LED chip package of claim 1, further comprising a transparent resin layer formed between the LED chip and the reflector layer and transmitting the excited light.

* * * * *